United States Patent [19]

Salbreux

[11] Patent Number: 5,581,095
[45] Date of Patent: Dec. 3, 1996

[54] BIDIRECTIONAL SHOCKLEY DIODE HAVING OVERLAPPING EMITTER REGIONS

[75] Inventor: Jean-Claude Salbreux, Saint Cyr sur Loire, France

[73] Assignee: SGS-Thomson Microelectronics S.A., Saint Genis Pouilly, France

[21] Appl. No.: 298,074

[22] Filed: Aug. 30, 1994

[30] Foreign Application Priority Data

Sep. 7, 1993 [FR] France .................................. 93 10883

[51] Int. Cl.⁶ .................. H01L 29/74; H01L 31/111; H01L 23/62; H02H 9/00
[52] U.S. Cl. .................. 257/110; 257/132; 257/163; 257/173; 257/355; 361/58
[58] Field of Search ........................ 257/355, 110, 257/132, 146, 163, 164, 165, 173, 174; 361/58

[56] References Cited

U.S. PATENT DOCUMENTS

| | | | |
|---|---|---|---|
| 3,476,993 | 11/1969 | Aldrich et al. | 257/110 |
| 4,868,703 | 9/1989 | Borkowicz | 361/58 |
| 5,352,905 | 10/1994 | Ohta | 257/110 |

FOREIGN PATENT DOCUMENTS

| | | | |
|---|---|---|---|
| 0537843 | 4/1993 | European Pat. Off. | 257/110 |
| 53-124988 | 10/1978 | Japan | 257/110 |
| 4-17369 | 1/1992 | Japan | 257/110 |

OTHER PUBLICATIONS

Patent Abstracts of Japan, vol. 2, No. 156 (E–81), Dec. 26, 1978.

*Primary Examiner*—Steven H. Loke
*Attorney, Agent, or Firm*—David M. Driscoll; James H. Morris; Brett N. Dorny

[57] ABSTRACT

A bidirectional Shockley diode includes an N-type layer sandwiched between two P-type layers. A first N-type region in the P-type region extends over substantially one half of the upper surface. A second N-type region extends in the P-type layer substantially over one half of the lower surface. Each first and second region protrudes with respect to the median plane of the component by a length r such that ratio r/e is smaller than 0.5, e being the thickness of the component.

11 Claims, 3 Drawing Sheets

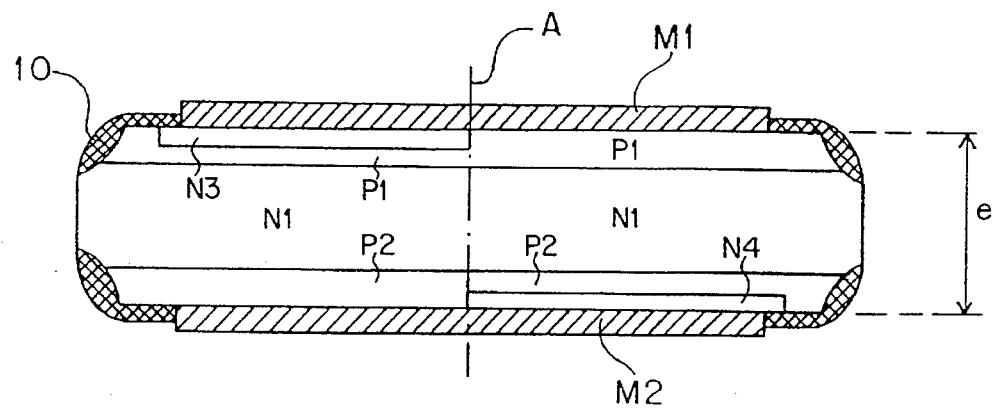
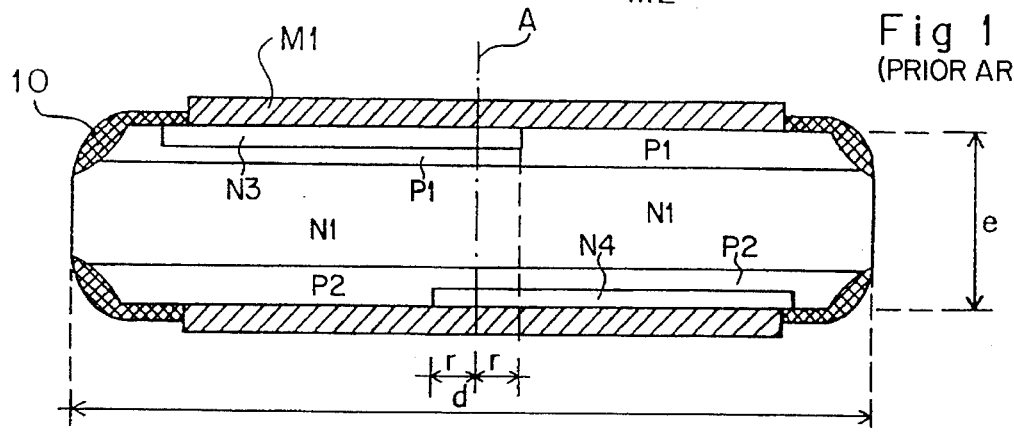
Fig 1 (PRIOR ART)
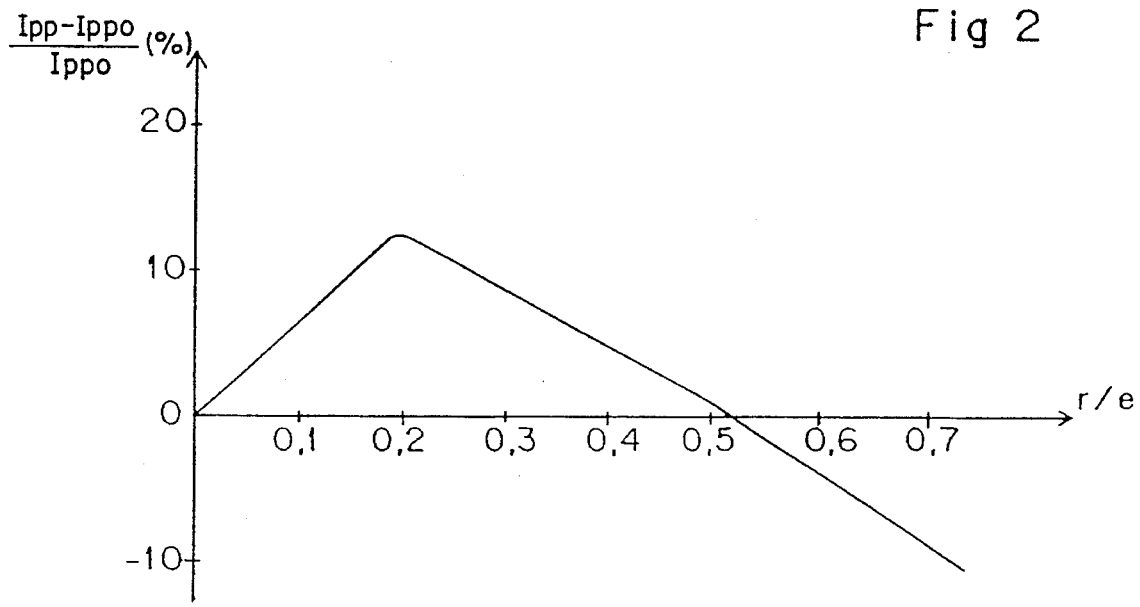
Fig 2
Fig 3

5,581,095

BIDIRECTIONAL SHOCKLEY DIODE HAVING OVERLAPPING EMITTER REGIONS

BACKGROUND OF THE INVENTION

1. Field of the Invention

The present invention relates to protection components and more particularly to bidirectional protection components, that is, components capable of absorbing negative overcharges as well as positive overcharges, such as a bidirectional Shockley diode or gateless triac.

2. Discussion of the Related Art

Bidirectional Shockley diodes exhibit the same breakover voltage VBO in each polarity. When the voltage between their terminals exceeds this breakover voltage, the components become conductive and exhibit at their terminals a very low voltage drop. Then, they remain conductive as long as the current flowing therethrough remains higher than a hold current value IH.

Another major characteristic of these components is the power or the maximum current they can withstand during an overcharge. It is known that this current depends upon the component's surface.

SUMMARY OF THE INVENTION

An object of the present invention is to allow an increase in the maximum current IPP that can be withstood by a bidirectional Shockley diode for a determined surface of this Shockley diode.

To achieve this object, the present invention provides a protection component of the bidirectional Shockley diode-type including a layer of a first conductivity type sandwiched between two layers of the second conductivity type, a first region of the first conductivity type formed from the upper surface of the substrate in the layer of the second conductivity type and extending over substantially one half of this upper surface, and a second region of the first conductivity type formed from the lower surface of the substrate in the layer of the second conductivity type and extending substantially over one complementary half of the surface of this lower surface. Each first and second region protrudes with respect to the median plane of the component by a length r such that r/e is smaller than 0.5, e being the thickness of the component.

According to an embodiment of the invention, r/e is between 0.1 and 0.3.

According to an embodiment of the invention, r/e is close to 0.2.

According to an embodiment of the invention, the first conductivity type is N-type.

According to an embodiment of the invention, the component is of the mesa-type.

According to an embodiment of the invention, the component is of the planar-type.

The present invention advantageously increases the maximum current that can be withstood by a protection device of the bidirectional Shockley diode type, having a determined size, without having to modify the component manufacturing characteristics but by modifying only the pattern of the emitter diffusion mask.

The foregoing and other objects, features, aspects and advantages of the invention will become apparent from the following detailed description of the present invention when taken in conjunction with the accompanying drawings.

BRIEF DESCRIPTION OF DRAWINGS

FIG. 1 is a cross-sectional view of a bidirectional Shockley diode of the mesa-type according to the prior art;

FIG. 2 is a cross-sectional view of a bidirectional Shockley diode of the mesa-type according to the present invention;

FIG. 3 is a curve illustrating the advantages obtained with the present invention;

Figure 4:
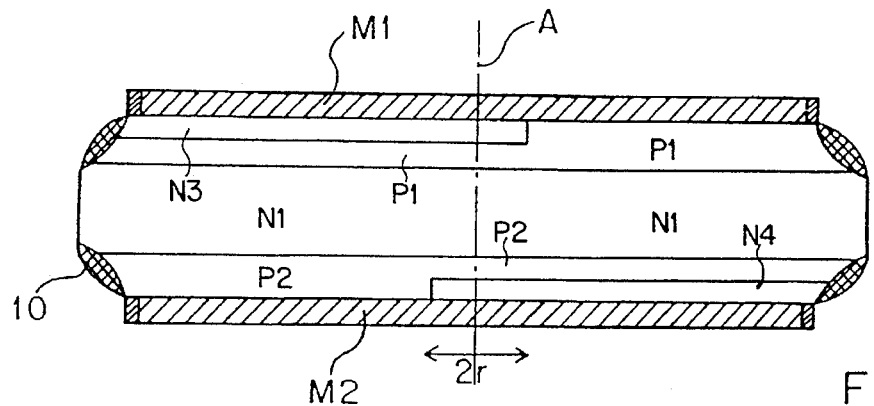
FIG. 4 is a cross-sectional view of a second bidirectional Shockley diode of the mesa-type according to the invention.

As is conventional in integrated circuit representations, the various drawings representing cross-sectional views and top views of the components (except FIG. 6) are schematic and are not drawn to scale. More particularly, the edges of the diffused regions are schematically represented without taking into account that they are rounded up following diffusion steps.

DETAILED DESCRIPTION

FIG. 1 is a schematic cross-sectional view of a conventional bidirectional Shockley diode. The Shockley diode includes an N-type substrate N1 in the upper and lower surfaces of which are formed a P-type diffused layer, P1, P2. In each P-type layer P1, P2, an N-type region, N3, N4, usually referred as an emitter region, is formed from the upper surface and lower surface of the component. Conventionally, as represented in FIG. 1, each N-type region N3, N4 occupies substantially one half of the surface of the component and each region does not project over the other. The N-type regions are symmetrically disposed with respect to a median plane A. The upper and lower surfaces of the component are coated with metallizations M1, M2. In the structure represented in FIG. 1, the component is of the mesa-type, that is, its periphery is grooved and coated with a passivation layer 10, usually a glassivation. Generally layer 10 extends partially over the upper surface of the component up to the periphery of regions N3 and N4. Accordingly, metallizations M1 and M2 do not contact the surfaces of regions P1 and P2 extending in the peripheral portion of regions N3 and N4.

So, there is provided, on both sides of the median plane A, a first unidirectional Shockley diode constituted by the regions N3, P1, N1, and P2 and a second unidirectional Shockley diode constituted by the regions P1, N1, P2, and N4. These Shockley diodes are strictly identical and are used to absorb negative and positive overcharges, respectively, between metallizations M1 and M2.

As indicated above, one of the major features of a protection component is the maximum current IPP that it can withstand.

To increase this current, the present invention modifies the structure of FIG.1 in the manner indicated in FIG. 2.

FIG. 2 shows a structure identical to the structure of FIG. 1 except for the N-type regions N3, N4 which have a determined overlapping region. Each N-type region N3, N4 extends beyond the median plane A a distance r. Thus, regions N3 and N4 exhibit an overlapping length of 2r. Since the doping levels and other operating characteristics remain unchanged, the basic breakdown voltage parameters are not modified. However, the applicant has noticed that the provision of this partial overlapping of layers N3 and N4 causes an increase in the peak current value IPP that can be withstood by the component.

This characteristic is illustrated in FIG. 3 where the abscissa corresponds to the ratio r/e, where e is the component thickness. More particularly, e is the thickness of the component reduced by the thickness of one N-type region N3, N4. The ordinate indicates the variation in percent of the maximum current IPP for the present invention with respect to the maximum current $IPP_0$ of a conventional component, such as the one of FIG. 1, in which regions N3 and N4 do no overlap. First, it is noted that as ratio r/e increases, current IPP also increases. An increase higher than 10% is obtained for a ratio r/e substantially equal to 0.2. Then, the current IPP decreases while remaining higher than $IPP_0$ up to a value of ratio r/e substantially equal to 0.5. If overlapping is further increased, current IPP becomes lower than current $IPP_0$, that is, the increased overlapping becomes detrimental.

In practice, the thickness of a Shockley diode ranges from 0.2 to 0.35 mm (200–350 µm), that is, for a ratio r/e equal to 0.2, distance r is equal to 40–70 µm. In technologies commonly used for fabricating semiconductor components, these values are far from being negligible since the various masking operations are generally realized with an accuracy of approximately 1–3 µm.

FIG. 4 represents a second embodiment of the present invention. In FIG. 4, regions N3 and N4 extend up to the periphery of the component which is, as above, a mesatype component. FIG. 4 also represents the case when the metallizations M1 and M2 extend up to the periphery of the component. In this case, the implementation of the invention provides similar advantages as those described above.

Figure 5A:
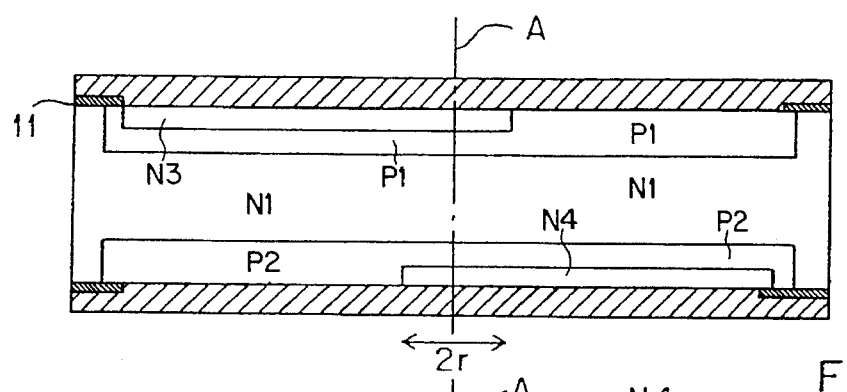
FIG. 5A is a cross-sectional view representing a third bidirectional Shockley diode of the planar-type according to the invention.

FIG. 5A is a third embodiment of a bidirectional Shockley diode of a planar-type according to the present invention. In this case, regions P1 and P2, instead of being layers extending all over the upper and lower surface of the component, are wells that are laterally delineated, and region N1 peripherally extends up to the upper and lower surfaces of the component. N-type regions N3, N4 are formed as discussed above in each region P1 and P2. In this embodiment, the apparent surfaces of the layers are coated with a passivation layer 11, commonly silicon oxide. In this case also, the implementation of the invention provides the same advantages as those described above.

Figure 5B:
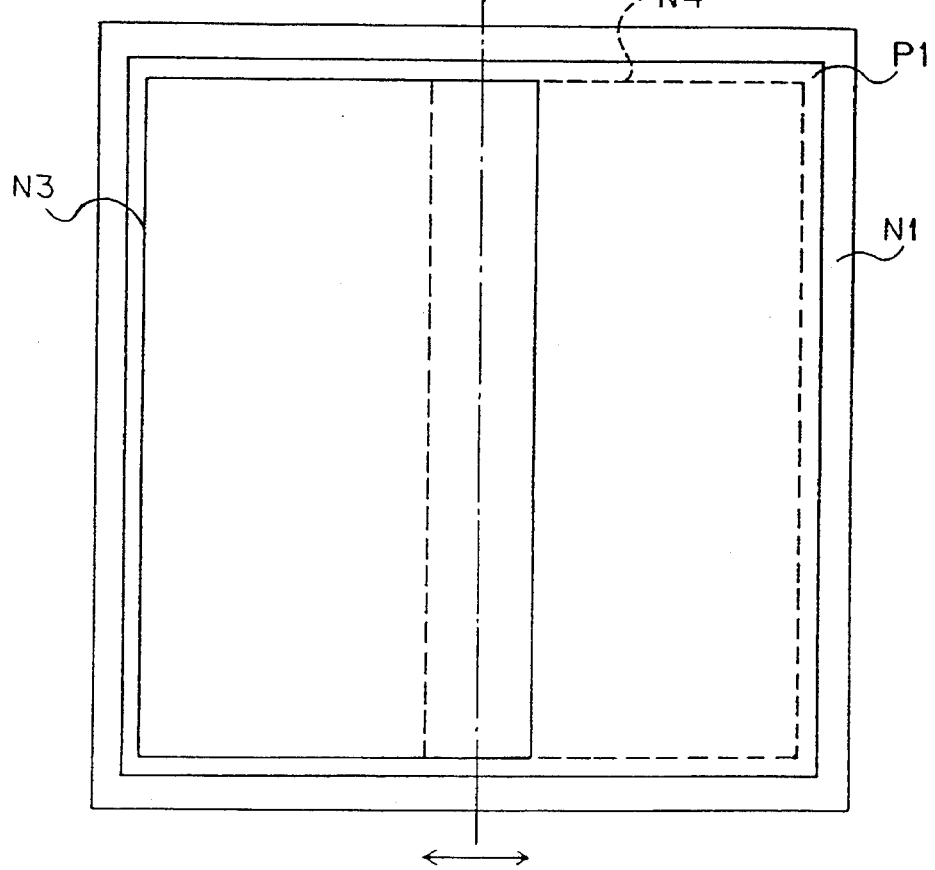
FIG. 5B is a schematic top view corresponding to FIG. 5A.

FIG. 5B is a top view corresponding to the cross-sectional view of FIG. 5A. FIG. 5B shows, at the periphery, the region N1 where the well P1 is formed. Solid lines delineate the boundaries of region N3 and dashed lines delineate the boundaries of region N4. The overlapping 2r between these layers is clearly shown.

Figure 6:
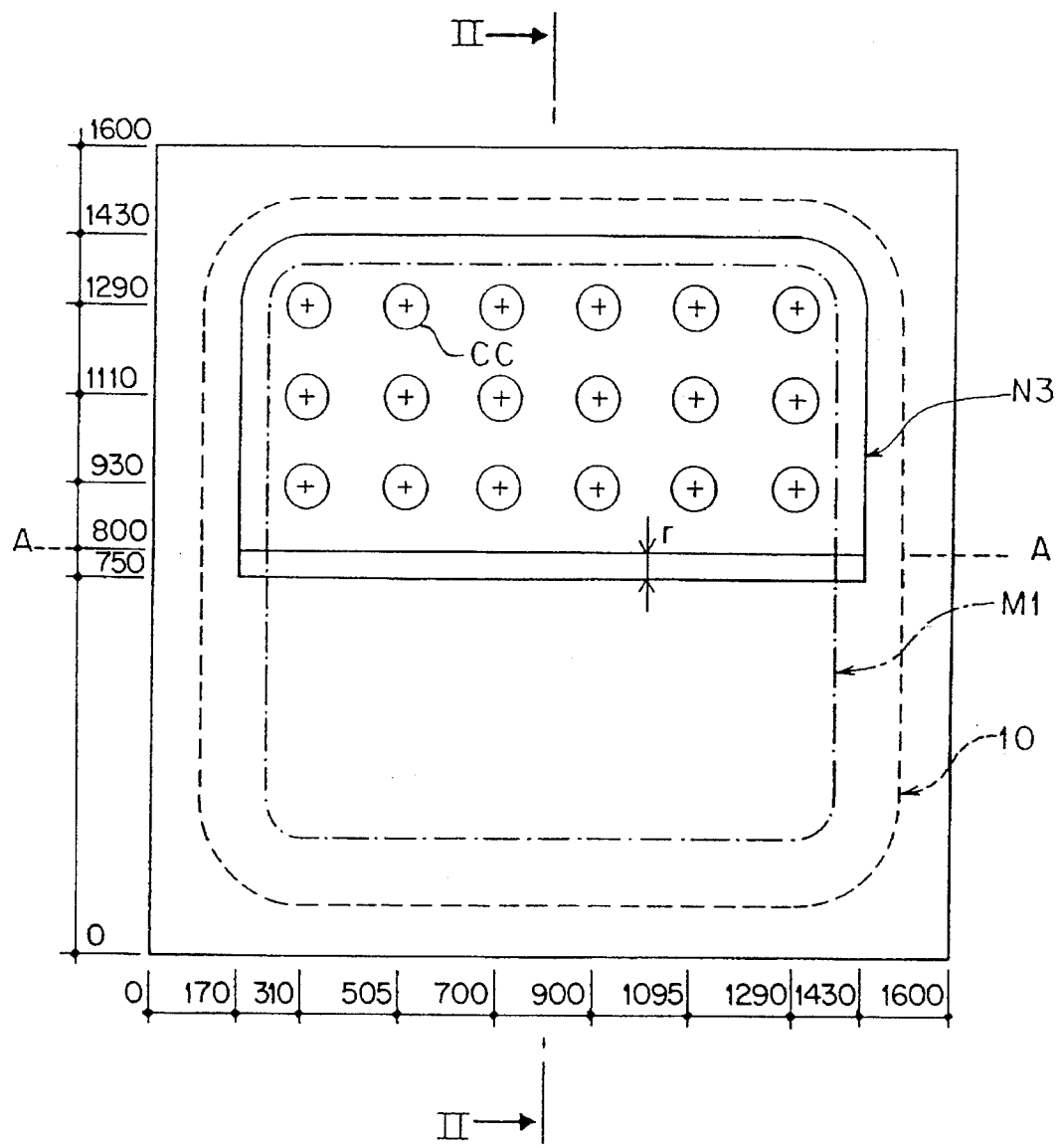
FIG. 6 is a top view, drawn to scale, of a diode according to the invention in the embodiment of FIG. 2.

Practical tests of the present invention have been carried out by using a structure such as the one represented in FIG. 2, a top view of which is represented in FIG. 6. FIG. 2 is a cross-sectional view along the line II—II of FIG. 6. In FIG. 6, reference number 10 indicates the groove edges (with a width of approximately 100 µm), reference M1 indicates the limit of the upper metallization, and reference N3 indicates the outline of the emitter region overlapping the median plane A by approximately 50 µm. It will be noted that the region N3 is interrupted in areas CC that conventionally constitute emitter shorts (in this case, 18 holes of 90 µm in diameter).

The components had characteristics chosen in the following ranges:

thickness: 270 µm
size: 1.6×1.6 mm$^2$
doping level of layer N1: $1.5 \times 10^{15}$–$10^{17}$ at/cm$^3$
doping level of P1 and P2: $C_s = 5 \times 10^{17}$–$5 \times 10^{18}$ at/cm$^3$
junction depth: $x_p = 25$–$45$ µm
doping level of N3 and N4: $C_s = 10^{19}$ at/cm$^3$
junction depth: $x_p = 15$–$25$ µm
breakdown voltage: 60–320 V
($C_s$ being the surface doping level)

With a conventional component, identical to the component of FIGS. 2 and 6 but in which r=0, one obtains a value $IPP_0 = 67$ A, and for a component of the type of FIG. 6 in which ratio r/e is substantially equal to 0.2, a value IPP=75 A is obtained.

In this example, it should be noted that the overlapping length r with respect to the median plane (50 µm) corresponds to at leash 10% of the width of region N3 up to the median plane (0.65 mm).

Moreover, the invention applies also ho a structure where all the conductivity types would be reversed, that is, the structure would be realized from a P-type substrate.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A protection component of a bidirectional Shockley diode-type comprising:

a semiconductor substrate including a semiconductor layer of a first conductivity type sandwiched between two semiconductor layers of a second conductivity type;

a first semiconductor region of the first conductivity type formed from a portion of an upper surface of the semiconductor substrate substantially on a first side of a median plane of the semiconductor substrate; and a second semiconductor region of the first conductivity type formed from a portion of a lower surface of the semiconductor substrate substantially on a second side of the median plane of the semiconductor substrate;

wherein said first and second semiconductor regions each protrude with respect to the median plane of the semiconductor substrate by a length r such that a ratio r/e is less than 0.5, wherein e is a thickness of the semiconductor substrate.

2. The protection component of claim 1, wherein the ratio r/e is between 0.1 and 0.3.

3. The protection component of claim 1, wherein the ratio r/e is substantially 0.2.

4. The protection component of claim 1, wherein the first conductivity type is N-type.

5. The protection component of claim 1, wherein the component is of a mesa-type.

6. The protection component of claim 1, wherein the component is of a planar-type.

7. A protection component of a bidirectional Shockley diode type comprising:

a semiconductor substrate including a first semiconductor layer of a first conductivity type;

a second semiconductor layer of a second conductivity type formed in an upper surface of said semiconductor substrate;

a third semiconductor layer of said second conductivity type formed in a lower surface of said semiconductor substrate;

a fourth semiconductor layer of said first conductivity type formed in an upper surface of said second semiconductor layer; and a fifth semiconductor layer of said first conductivity type formed in a lower surface of said third semiconductor layer;

wherein said fourth and fifth semiconductor layers extend across a portion of each of the upper and lower surfaces of said semiconductor substrate, respectively, on opposite sides of a median plane of said semiconductor substrate, said fourth and fifth semiconductor layers overlap with respect to said median plane of said semiconductor layer distance r, wherein said distance r is less than 0.5e, wherein e is the thickness of the semiconductor substrate.

8. The protection component of claim 7, wherein said distance r is substantially 0.2e.

9. The protection component of claim 7, further comprising:

a first metalization layer substantially covering said upper surface of the second semiconductor layer and a upper surface of said fourth semiconductor layer; and a second metalization layer substantially covering said lower surface of the third semiconductor layer and a lower surface of said fifth semiconductor layer.

10. The protection component of claim 9, further comprising:

at least one passivation layer formed so as to prevent said first and second metalization layers from contacting portions of respective surfaces of said second and third semiconductor layers.

11. The protection component of claim 7, further comprising emitter shorts formed in portions of said fourth and fifth semiconductor layers.

* * * * *